United States Patent
Yan et al.

(10) Patent No.: US 12,400,884 B2
(45) Date of Patent: Aug. 26, 2025

(54) FILM REMOVAL APPARATUS AND UNCOVERING MECHANISM

(71) Applicant: WISTRON CORP., New Taipei (TW)

(72) Inventors: Zeshan Yan, New Taipei (TW); Shun-Chi Yeh, New Taipei (TW); Fuhua Yan, New Taipei (TW); Chen Qin, New Taipei (TW)

(73) Assignee: WISTRON CORP., New Taipei (TW)

( * ) Notice: Subject to any disclaimer, the term of this patent is extended or adjusted under 35 U.S.C. 154(b) by 136 days.

(21) Appl. No.: 18/460,643

(22) Filed: Sep. 4, 2023

(65) Prior Publication Data
US 2024/0429072 A1    Dec. 26, 2024

(30) Foreign Application Priority Data
Jun. 21, 2023   (CN) .......................... 202310746220.8

(51) Int. Cl.
*B32B 43/00* (2006.01)
*H01L 21/67* (2006.01)
*H01L 21/683* (2006.01)

(52) U.S. Cl.
CPC ...... *H01L 21/67132* (2013.01); *B32B 43/006* (2013.01); *H01L 21/6838* (2013.01); *Y10T 156/1132* (2015.01); *Y10T 156/1174* (2015.01); *Y10T 156/1944* (2015.01); *Y10T 156/195* (2015.01)

(58) Field of Classification Search
CPC ............. B32B 43/006; Y10T 156/1132; Y10T 156/1174; Y10T 156/1944; Y10T 156/195; Y10T 156/1179; Y10T 156/1983
See application file for complete search history.

(56) References Cited

U.S. PATENT DOCUMENTS 4,775,438 A * 10/1988 Funakoshi ............... B44D 3/16
                                                 156/716
6,824,643 B2 * 11/2004 Yoshimoto ........ H01L 21/67132
                                                 438/464

(Continued)

FOREIGN PATENT DOCUMENTS

CN      109599355 A     4/2019
CN      211088215 U     7/2020

(Continued)

OTHER PUBLICATIONS

TW Office Action dated 2024-03-29 in Taiwan application No. 112124597.

*Primary Examiner* — Philip C Tucker
*Assistant Examiner* — Nickolas R Harm
(74) *Attorney, Agent, or Firm* — McClure, Qualey & Rodack, LLP

(57) ABSTRACT

This disclosure relates to a film removal apparatus that is suitable for uncovering a film of a semiconductor substrate and includes a carrier, an uncovering mechanism and a lifting mechanism. The carrier supports the semiconductor substrate. The uncovering mechanism includes a slider, a guider and a roller. The slider is slidably disposed on the carrier. The guider is fixed to the slider. The roller is rotatably disposed on the slider and arranged beside the guider. The uncovering mechanism is to uncover the film from the semiconductor substrate. The lifting mechanism selectively separates the semiconductor substrate away from the carrier.

19 Claims, 21 Drawing Sheets

(56) References Cited

U.S. PATENT DOCUMENTS

| | | | |
|---|---|---|---|
| 7,115,482 B2* | 10/2006 | Maki | H01L 21/67132 |
| | | | 438/33 |
| 8,092,645 B2* | 1/2012 | Yip | H01L 21/67132 |
| | | | 156/707 |
| 9,039,867 B2* | 5/2015 | Barmettler | H01L 21/67005 |
| | | | 156/716 |
| 10,286,643 B2* | 5/2019 | Park | B32B 37/06 |
| 2008/0236743 A1* | 10/2008 | Kye | B29C 63/0013 |
| | | | 156/759 |
| 2010/0252205 A1* | 10/2010 | Chan | H01L 21/67132 |
| | | | 156/707 |
| 2016/0159069 A1* | 6/2016 | Huang | B32B 43/006 |
| | | | 156/707 |

FOREIGN PATENT DOCUMENTS

| | | |
|---|---|---|
| CN | 115440615 A | 12/2022 |
| TW | M589639 U | 9/2018 |
| TW | M631515 U | 9/2022 |

\* cited by examiner ered mechanism and a lifting mechanism. The carrier supports the semiconductor substrate. The uncovering mechanism includes a slider, a guider and a roller. The slider is slidably disposed on the carrier. The guider is fixed to the slider. The roller is rotatably disposed on the slider and arranged beside the guider. The uncovering mechanism is to uncover the film from the semiconductor substrate. The lifting mechanism selectively separates the semiconductor substrate away from the carrier.
FILM REMOVAL APPARATUS AND UNCOVERING MECHANISM

CROSS-REFERENCE TO RELATED APPLICATIONS

This non-provisional application claims priority under 35 U.S.C. § 119 (a) on Patent Application No(s). 202310746220.8 filed in China, P.R.C. on Jun. 21, 2023, the entire contents of which are hereby incorporated by reference.

TECHNICAL FIELD

The present disclosure relates to a film removal apparatus and an uncovering mechanism.

BACKGROUND

In general, a semiconductor substrate is placed on a frame so as to be easily transferred. Since the semiconductor substrate is typically supported by the frame through attachment of a film, the film needs to be peeled off the frame and the semiconductor substrate for detaching the semiconductor substrate from the frame. However, the film is conventionally peeled off in manual, which is time-consuming and may easily damage the component on the semiconductor substrate due to uneven peeling force.

SUMMARY

The present disclosure provides a film removal apparatus and an uncovering mechanism capable of efficiently, easily and evenly peeling a film off a semiconductor substrate while preventing damage of the semiconductor substrate or any component thereon.

According to one aspect of the present disclosure, a film removal apparatus suitable for uncovering a film of a semiconductor substrate includes a carrier, an uncovering mechanism and a lifting mechanism. The carrier supports the semiconductor substrate. The uncovering mechanism includes a slider, a guider and a roller. The slider is slidably disposed on the carrier. The guider is fixed to the slider. The roller is rotatably disposed on the slider and arranged beside the guider. The uncovering mechanism is to uncover the film from the semiconductor substrate. The lifting mechanism selectively separates the semiconductor substrate away from the carrier.

According to the film removal apparatus and the uncovering mechanism discussed above, the uncovering mechanism provided with the slider, the guider and the roller can uncover the film of the semiconductor substrate with a stable force, and mechanical operation thereof instead of manual work prevents accidental injury of human.

Further, the semiconductor substrate is lifted by the lifting mechanism, which prevents damage of the semiconductor substrate due to improper external force applied thereon during the lifting process.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
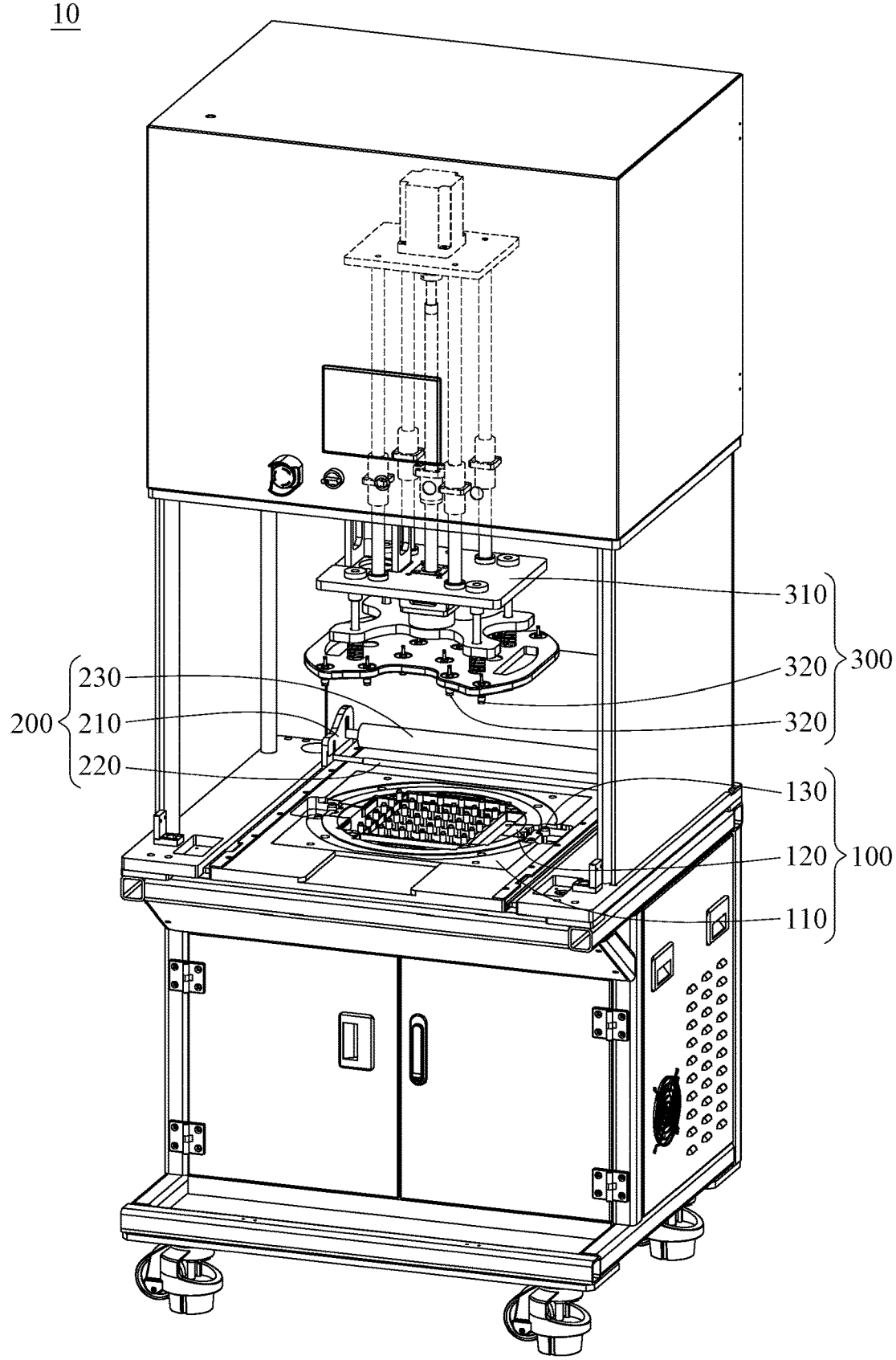
FIG. 1 is a perspective view of a film removal apparatus according to one embodiment of the present disclosure.
Figure 2:
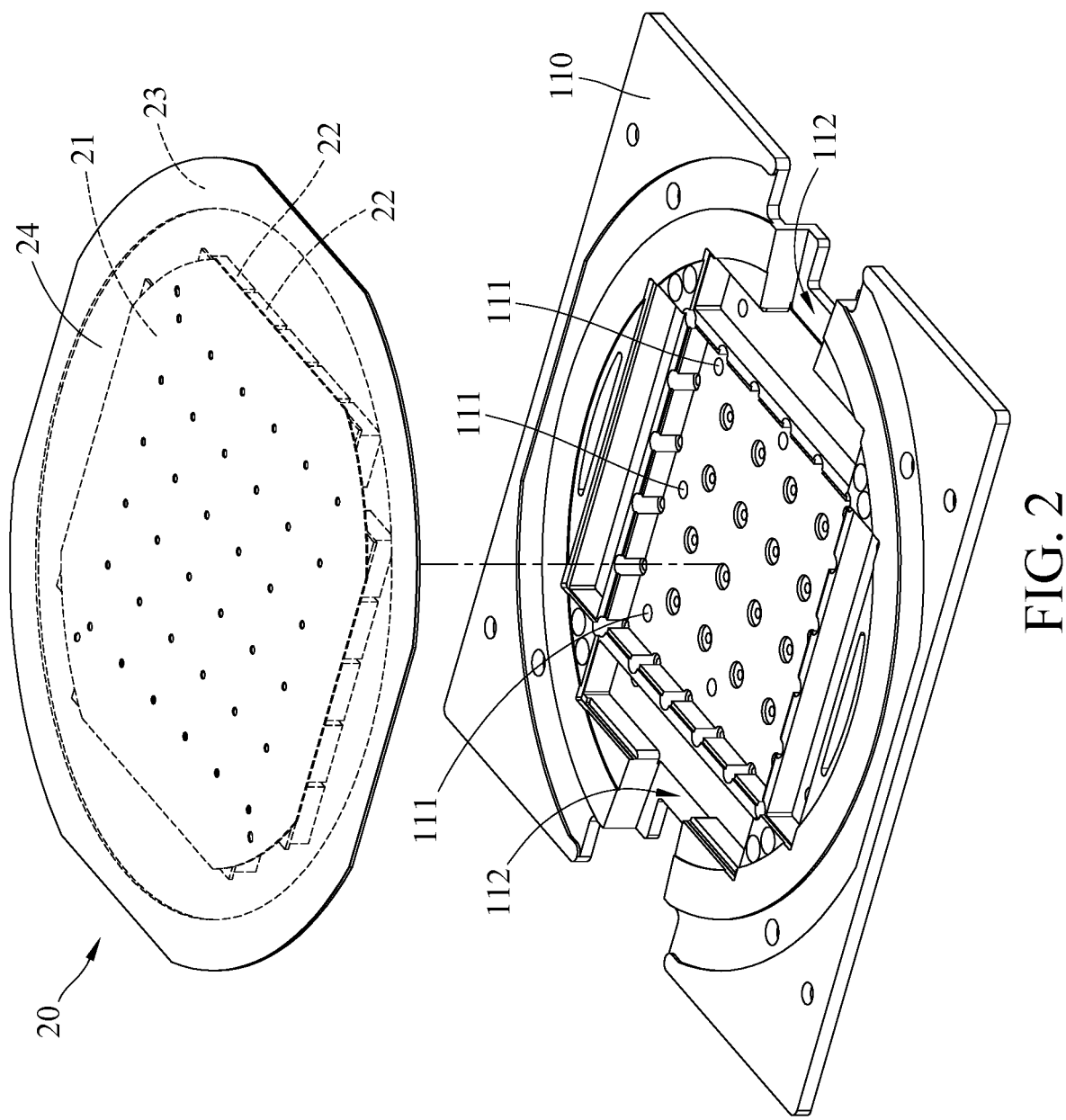
FIG. 2 is an exploded view of a base of a film removal apparatus according to one embodiment of the present disclosure and a semiconductor substrate.

Please refer to FIG. 1 and FIG. 2, where FIG. 1 is a perspective view of a film removal apparatus 10 according to one embodiment of the present disclosure, and FIG. 2 is an exploded view of a base 110 of the film removal apparatus 10 in FIG. 1 and a semiconductor substrate 20.

The film removal apparatus 10 provided in this embodiment is suitable for removing a film 24 of the semiconductor substrate 20. For example, the semiconductor substrate 20 may include a holder 21, a plurality of electronic parts 22, a fixed frame 23 and the film 24. The electronic parts 22 are stacked on the holder 21. The fixed frame 23 surrounds the holder 21, and the holder 21 holding the electronic parts 22 is fixed with respect to the fixed frame 23 through adhesion of the film 24.

Figure 12:
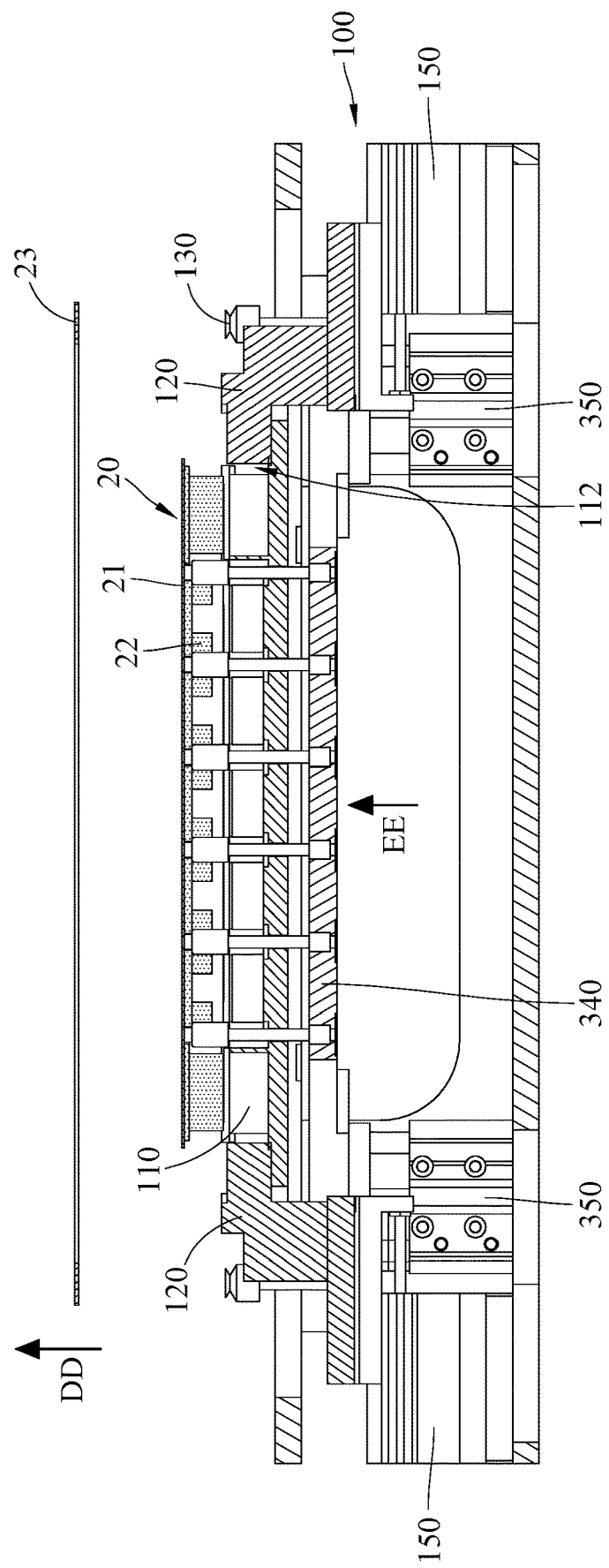
Figure 13:
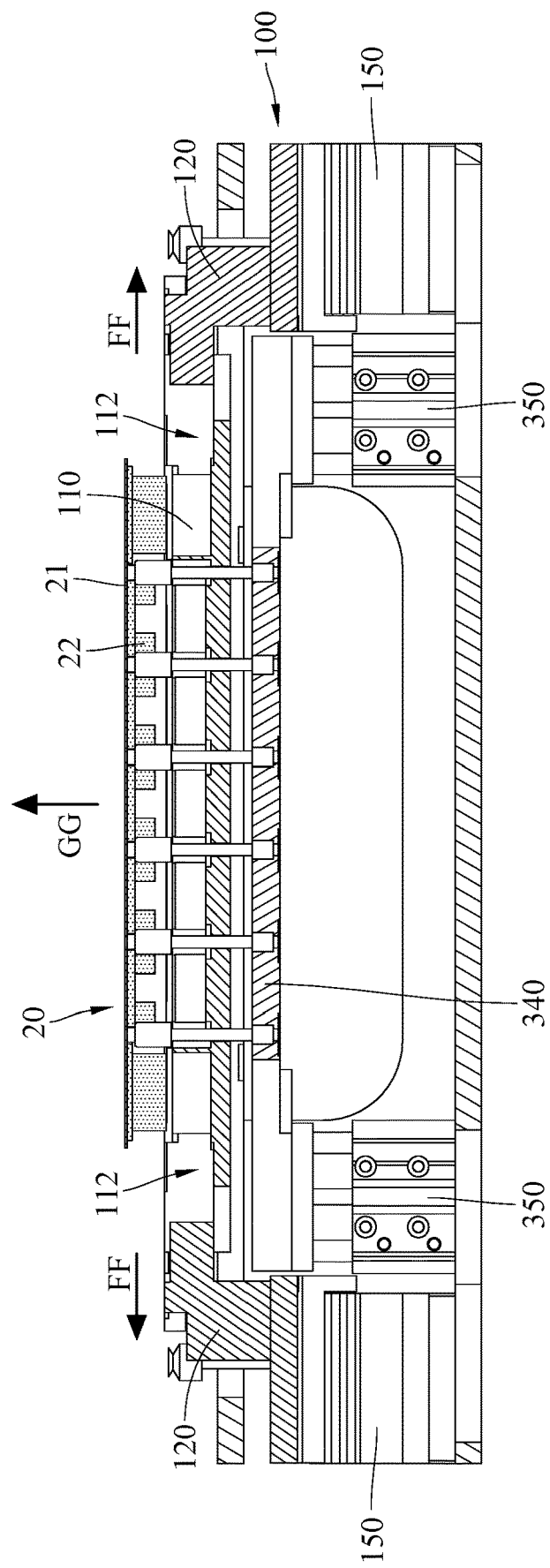

The film removal apparatus 10 includes a carrier 100, an uncovering mechanism 200 and a lifting mechanism 300. The carrier 100 supports the semiconductor substrate 20 and includes the base 110, two lateral movement components 120 and a plurality of holding nozzles 130. The base 110 may, for example, match the semiconductor substrate 20 in shape so as to support the semiconductor substrate 20. The base 110 has a plurality of holes 111 and two notches 112. The lateral movement components 120 are slidably disposed on the base 110 between a closed position (as shown in FIG. 12) and an open position (as shown in FIG. 13). As shown in FIG. 12, when the lateral movement components 120 are located at the closed position, the lateral movement components 120 are respectively located in the notches 112. As shown in FIG. 13, when the lateral movement components 120 are located at the open position, the lateral movement components 120 are at least partially located outside the notches 112, respectively. The holding nozzles 130 are disposed on the lateral movement components 120, and negative pressure may be generated at the holding nozzles 130 and the holes 111 to suck and fix the semiconductor substrate 20.

Please be noted that the quantities of the notches 112 and the lateral movement components 120 located at two opposite sides of the base 110 in this embodiment are not intended to restrict the present disclosure. In some other embodiments of the present disclosure, there may be only one notch and one lateral movement component, and both of them are located at one side of the base.

Figure 3:
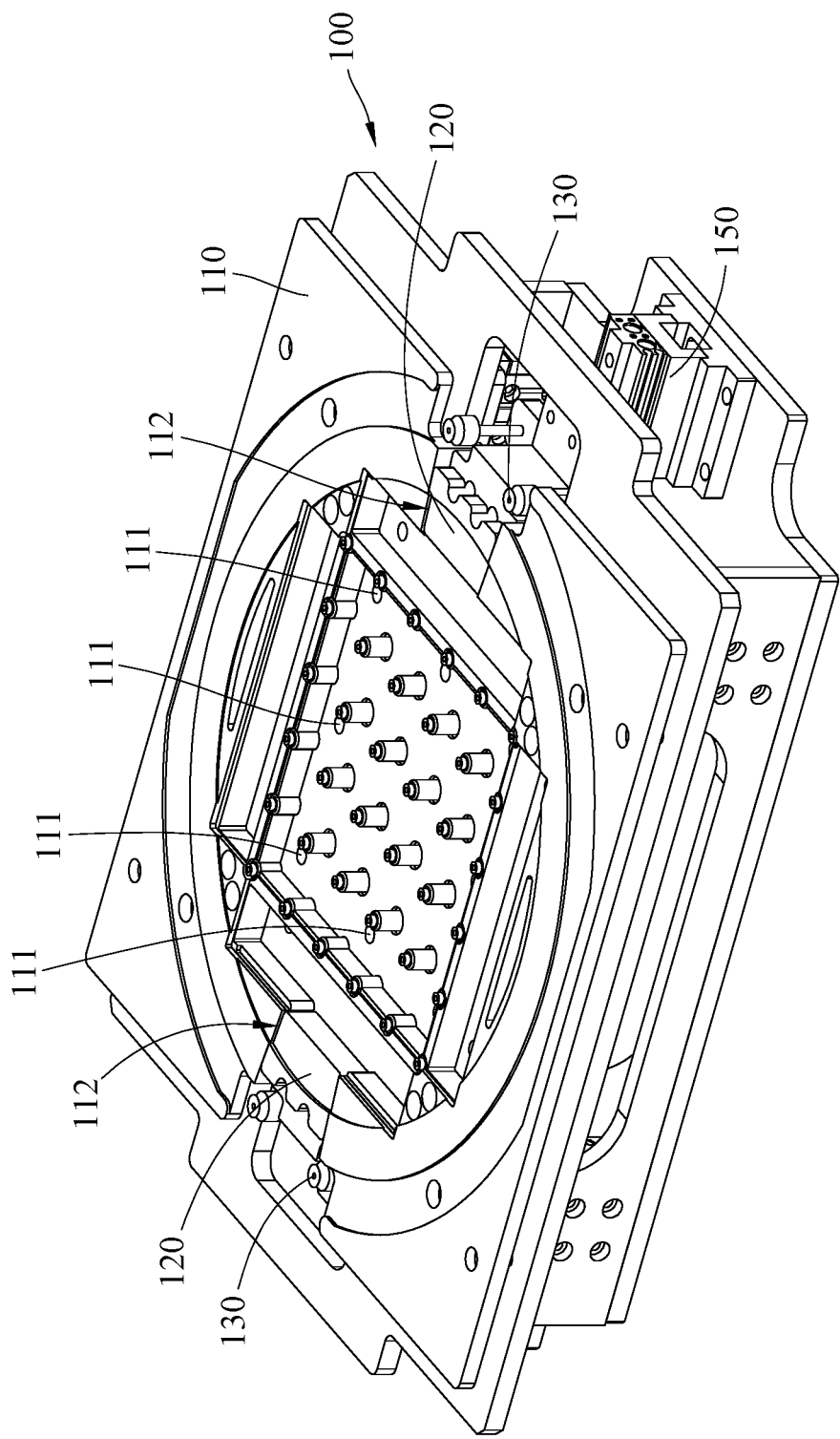
FIG. 3 is a partial and perspective view of a carrier of a film removal apparatus according to one embodiment of the present disclosure.

Please further refer to FIG. 3, which is a partial and perspective view of the carrier 100 of the film removal apparatus 10 in FIG. 1. The lateral movement components 120 are disposed in the carrier 100 via, for example, pneumatic cylinders 150. It can be also considered that the lateral movement components 120 are driven by the pneumatic cylinders 150 to be moved with respect to the base 110.

Figure 4:
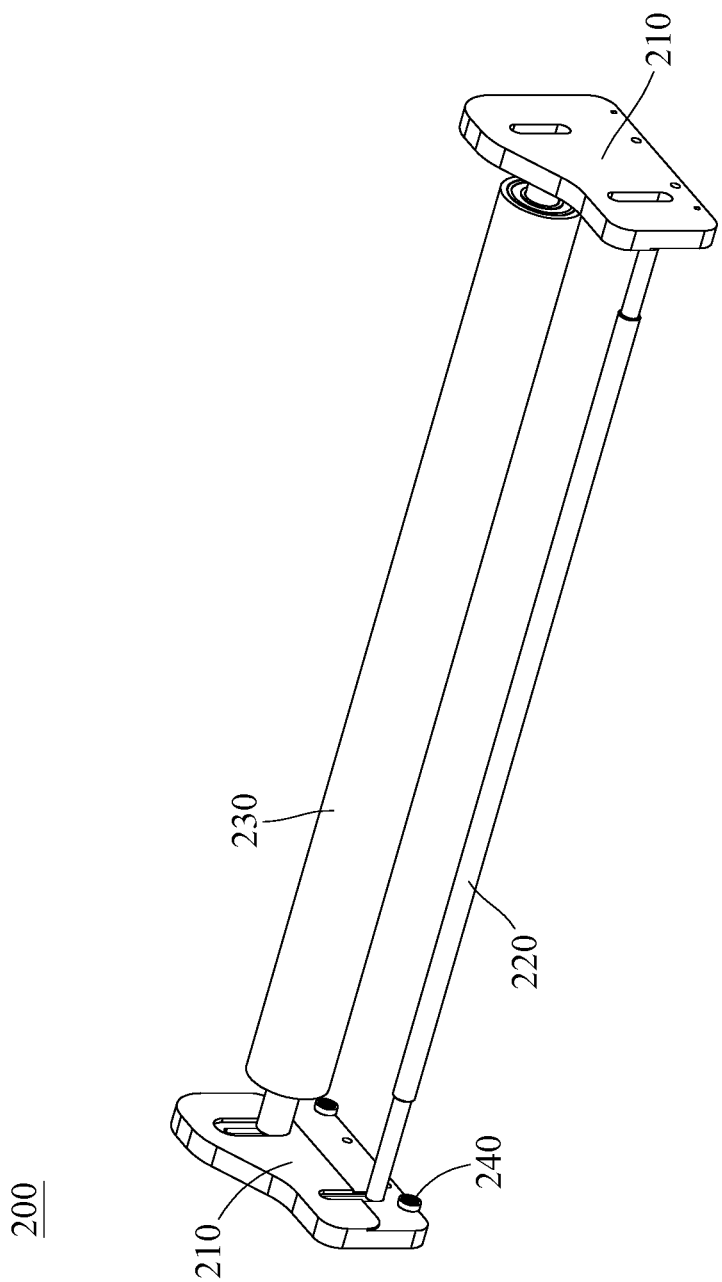
FIG. 4 is a perspective view of an uncovering mechanism of a film removal apparatus according to one embodiment of the present disclosure.

Please further refer to FIG. 4, which is a perspective view of the uncovering mechanism 200 of the film removal apparatus 10 in FIG. 1. The uncovering mechanism 200 includes two sliders 210, a guider 220 and a roller 230. The sliders 210 are slidably disposed on the carrier 100. The guider 220 is fixed to the sliders 210. The roller 230 is rotatably disposed on the sliders 210 and is arranged beside the guider 220. In order to smoothen the sliding of the sliders 210 with respect to the carrier 100, the uncovering mechanism 200 may, for example but not limited thereto, further include a plurality of wheels 240 rotatably disposed on the sliders 210 and placed on the carrier 100. Moreover, in order to smoothen the rotation of the roller 230 with respect to the sliders 210, the roller 230 may be, for example but not limited thereto, disposed on the sliders 210 via bearings (not shown).

Figure 5:
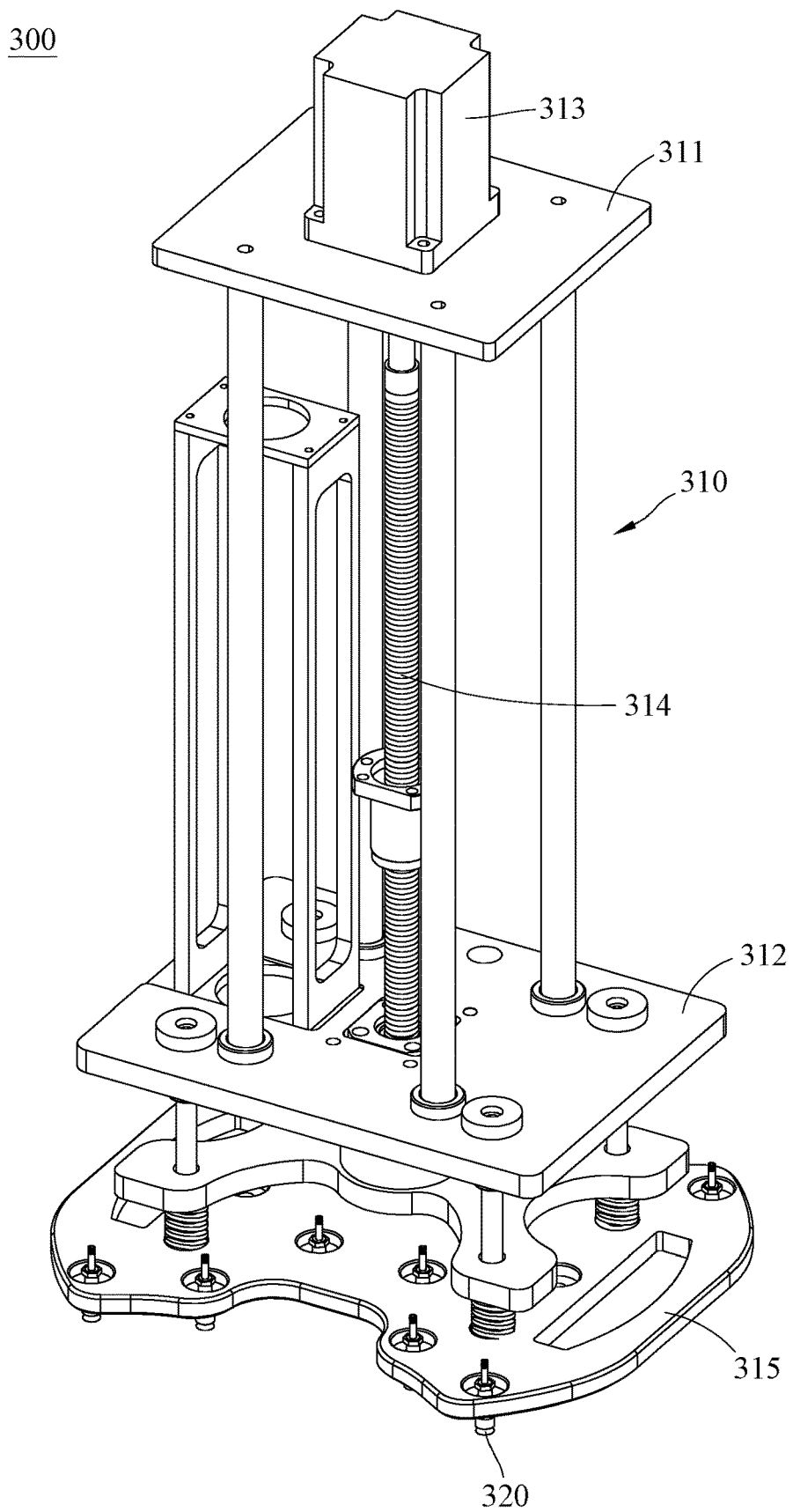
FIG. 5 is a perspective view of a lifting mechanism of a film removal apparatus according to one embodiment of the present disclosure.

Please further refer to FIG. 5, which is a perspective view of the lifting mechanism 300 of the film removal apparatus 10 in FIG. 1. The lifting mechanism 300 may include a movement assembly 310 and a plurality of transfer nozzles 320. The movement assembly 310 includes a fixed stand 311, a movable stand 312, a driving motor 313, a transmission set 314 and a nozzle holder 315. The movable stand 312 is movably disposed with respect to the fixed stand 311. The driving motor 313 is disposed on the fixed stand 311 and is connected to the movable stand 312 via the transmission set 314. The nozzle holder 315 may be connected to the movable stand 312 via, for example, elastic elements (e.g., springs). As such, during the operation of the driving motor 313, the transmission set 314 can be driven to move the movable stand 312 with respect to the fixed stand 311. In this embodiment, the transmission set 314 may be, for example but not limited thereto, a screw and a nut that match each other, such that the rotational motion of the driving motor 313 can be converted into linear motion of the movable stand 312 through the screw and the nut. The transfer nozzles 320 are disposed on the nozzle holder 315 to be lifted or lowered along with the nozzle holder 315. The transfer nozzles 320 selectively sucks and fixes the semiconductor substrate 20 and thus separates the semiconductor substrate 20 away from the base 110 of the carrier 100.

Please be noted that the movement manner of the movable stand 312 and the nozzle holder 315 with respect to the fixed stand 311 through the driving motor 313 and the transmission set 314 in this embodiment is not intended to restrict the present disclosure. In some other embodiments, the lifting mechanism may be wholly lifted or lowered with respect to the carrier of the film removal apparatus in a reasonable and proper manner.

In this embodiment, besides the movement assembly 310 and the transfer nozzles 320 set over the carrier 100, the lifting mechanism 300 may separate the semiconductor substrate 20 away from the base 110 of the carrier 100 through a different lifting manner. Please further refer to FIG. 6, which is a perspective view of the carrier 100 in FIG. 3 with the base 110 been omitted for convenience of observation. The lifting mechanism 300 further includes a pusher 340 movably disposed in the carrier 100. As such, when the pusher 340 is lifted with respect to the base 110, the pusher 340 is able to push up the semiconductor substrate 20 to be away from the carrier 100. Moreover, the pusher 340 in this embodiment is disposed in the carrier 100 through, for example, pneumatic cylinders 350. It can be also considered that the pusher 340 is driven by the pneumatic cylinders 350 to be moved with respect to the base 110.

Please be noted that the lifting manners achieved by the cooperation of the movement assembly 310 and the transfer nozzles 320 located over the carrier 100 and the cooperation of the pusher 340 and the pneumatic cylinders 350 disposed in the carrier 100 in this embodiment are not intended to restrict the present disclosure. In some embodiments of the present disclosure, the semiconductor substrate may be separated away from the carrier in just one lifting manner, such as the movement assembly and the transfer nozzles over the carrier, the pusher and the pneumatic cylinders in the carrier, or another reasonable and proper manner.

Figure 7:
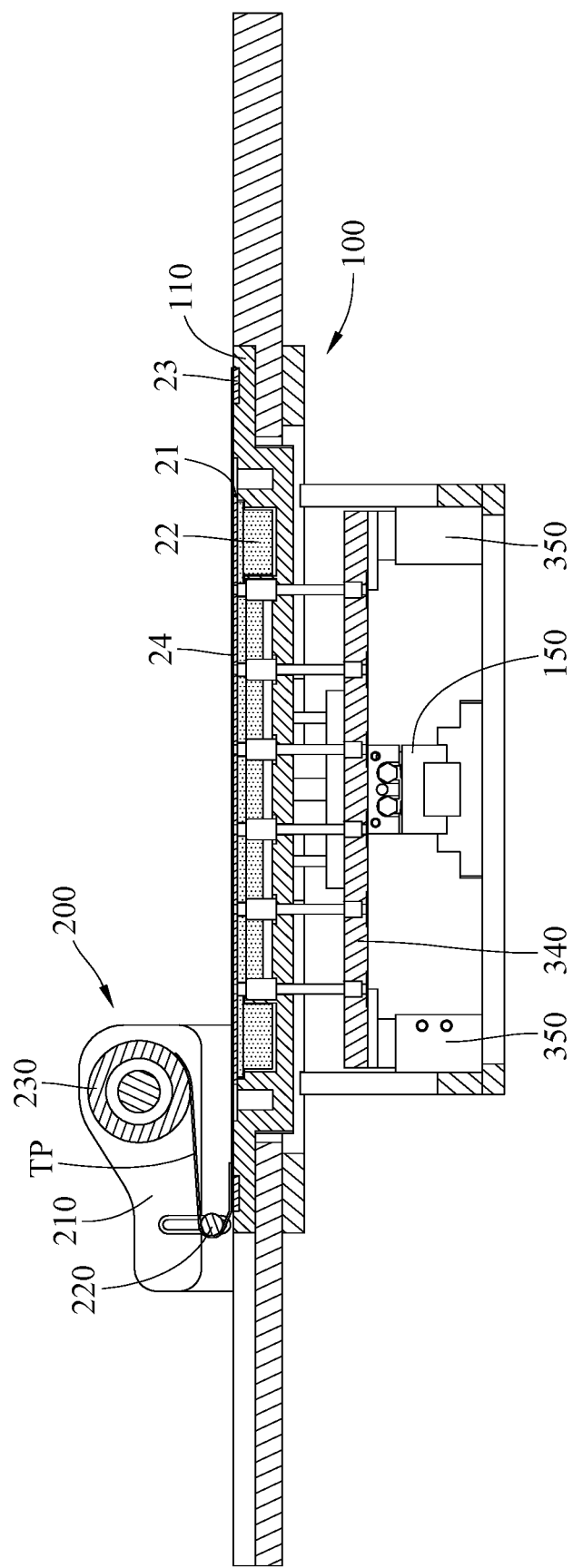
FIG. 7 to FIG. 13 are schematic views showing the action of a film removal apparatus according to one embodiment of the present disclosure.

Please refer to FIG. 7 to FIG. 13, which are schematic views showing the action of the film removal apparatus 10 in FIG. 1. First, as shown in FIG. 7, an adhesive tape TP has one end adhered to the film 24 of the semiconductor substrate 20 and another end adhered to the roller 230 via the guider 220 of the uncovering mechanism 200 before the uncovering process. That is, the film 24 of the semiconductor substrate 20 is connected to the roller 230 of the uncovering mechanism 200 via the adhesive tape TP. Please be noted that the adhesive tape TP can be adhered manually or mechanically, and the present disclosure is not limited thereto.

Figure 8:
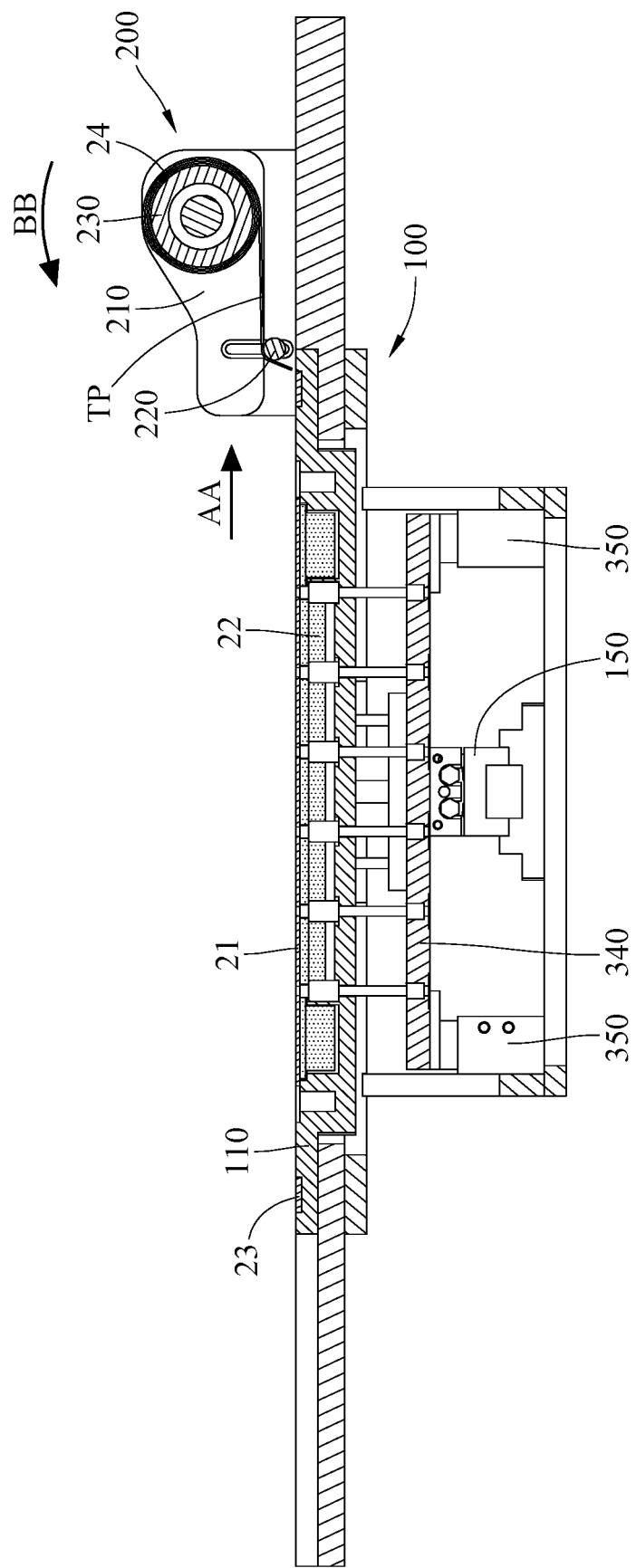

Then, as shown in FIG. 8, the uncovering mechanism 200 is pushed along a direction AA. During the movement of the uncovering mechanism 200, the film 24 of the semiconductor substrate 20 is forced to be gradually separated from the holder 21 and the fixed frame 23 of the semiconductor substrate 20, and the film 24 separated from the holder 21 and the fixed frame 23 of the semiconductor substrate 20 can be wound on the roller 230 through rotation of the roller 230 along a direction BB. By doing so, the uncovering mechanism 200 of this embodiment can uncover the film 24 of the semiconductor substrate 20 with a stable force, and mechanical operation thereof instead of manual work prevents accidental injury of human.

Figure 9:
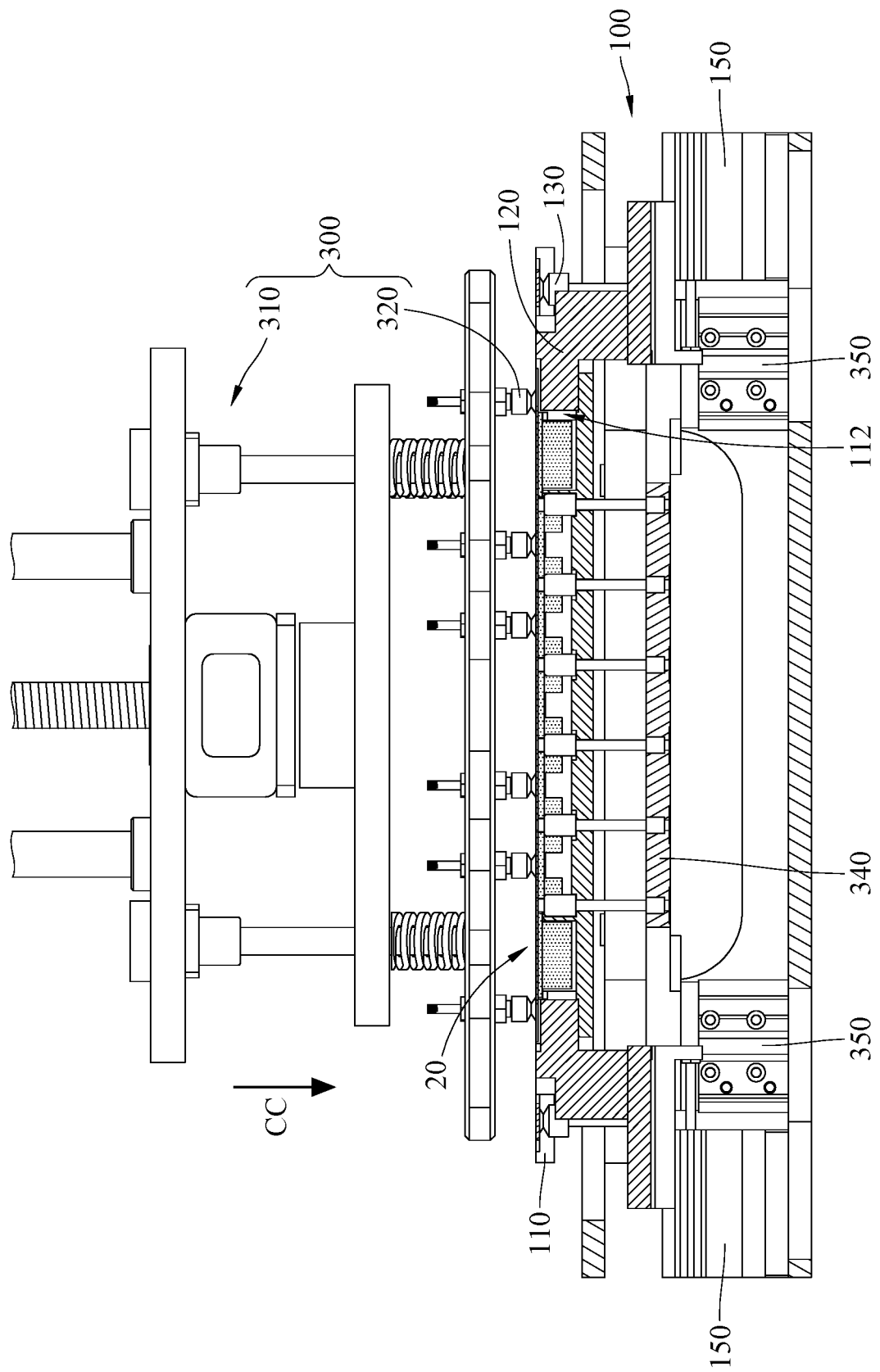
Figure 10:
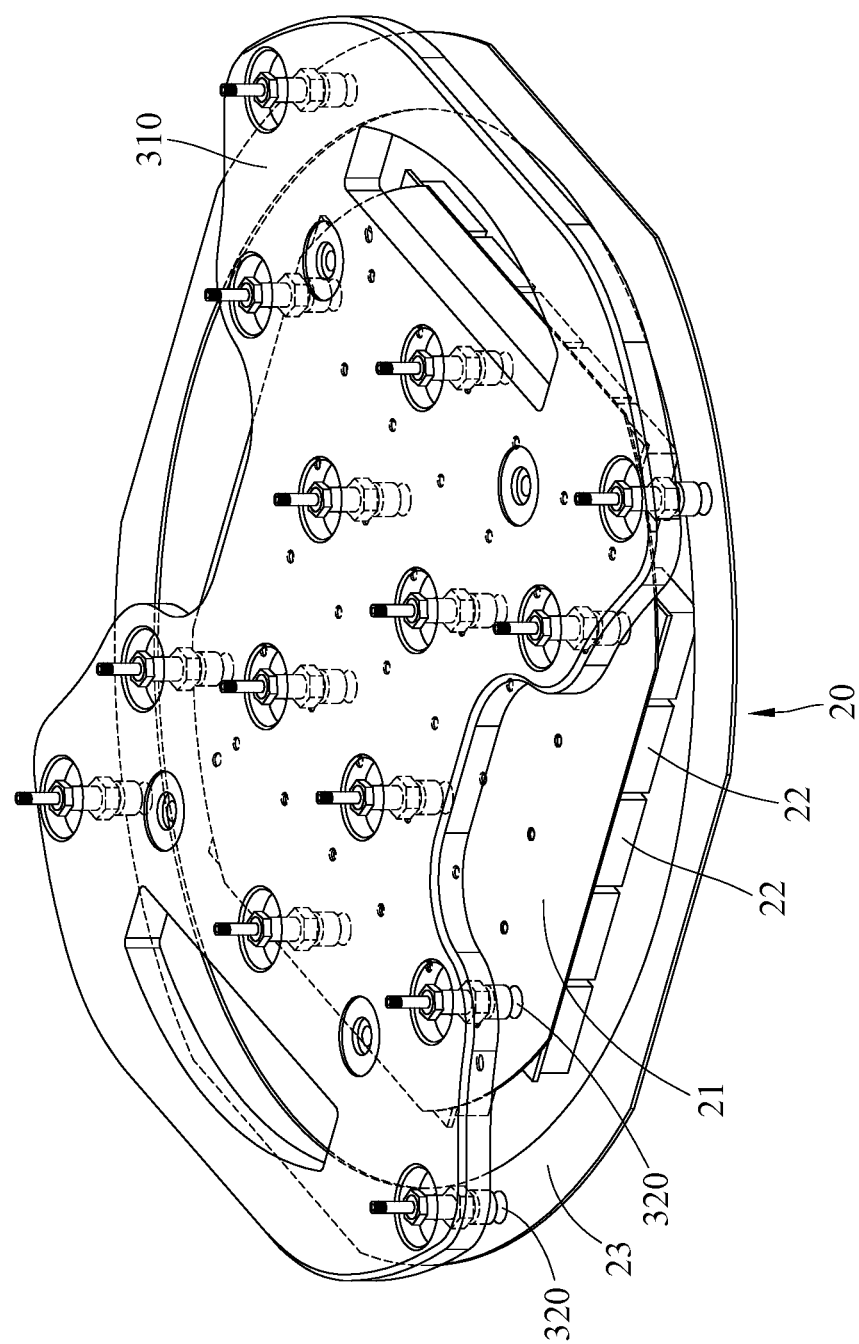

Then, as shown in FIG. 9 and FIG. 10, after the film 24 is completely peeled off, the transfer nozzles 320 of the lifting mechanism 300, for example, can be used to suck and fix the holder 21 and the fixed frame 23 of the semiconductor substrate 20 (along a direction CC), such that the holder 21 holding the electronic parts 22 and the fixed frame 23 can be lifted away from the base 110, and the rest part (not shown) of the semiconductor substrate 20 is remained on the base 110. Then, the fixed frame 23 and the holder 21 holding the electronic parts 22 can be sequentially removed from the transfer nozzles 320. Please be noted that in some other embodiments of the present disclosure, the transfer nozzles of the lifting mechanism can only suck and fix the holder of the semiconductor substrate, while the fixed frame and the rest part of the semiconductor substrate are remained on the base.

Please be noted that there is also another lifting manner achieved by the cooperation of the pusher 340 and the pneumatic cylinders 350 disposed in the carrier 100 in this embodiment. Therefore, the pusher 340 and the pneumatic cylinders 350 disposed in the carrier 100 can also be selected to separate the holder 21 holding the electronic parts 22 of the semiconductor substrate 20 away from the base 110.

Figure 11:
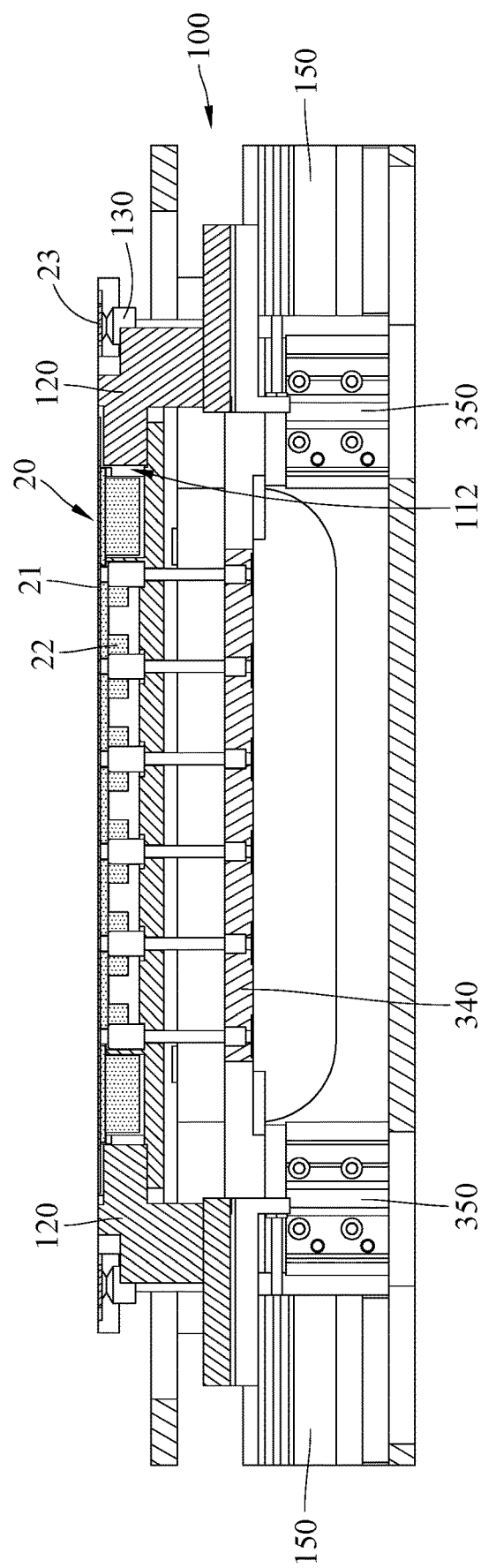

In detail, as shown in FIG. 11, the film 24 of the semiconductor substrate 20 is already removed from the holder 21 and the fixed frame 23 of the semiconductor substrate 20. Then, as shown in FIG. 12, the fixed frame 23 can be removed along a direction DD, and then the pusher 340 can be lifted along a direction EE through the driving of the pneumatic cylinders 350. As such, the pusher 340 is able to push up the holder 21 holding the electronic parts 22 of the semiconductor substrate 20 so as to separate the holder 21 holding the electronic parts 22 from the base 110.

Then, as shown in FIG. 13, the lateral movement components 120 are moved outside the notches 112 of the base 110 along directions FF by the driving of the pneumatic cylinders 150, so that the spaces in the notches 112 can be exposed for convenience of the careful removal of the holder 21 holding the electronic parts 22 (along a direction GG). Accordingly, the problems existing in convention of which the semiconductor substrate is difficult to be directly removed from the base and the semiconductor substrate is easily damaged due to uneven force applied thereon can be solved.

Figure 14:
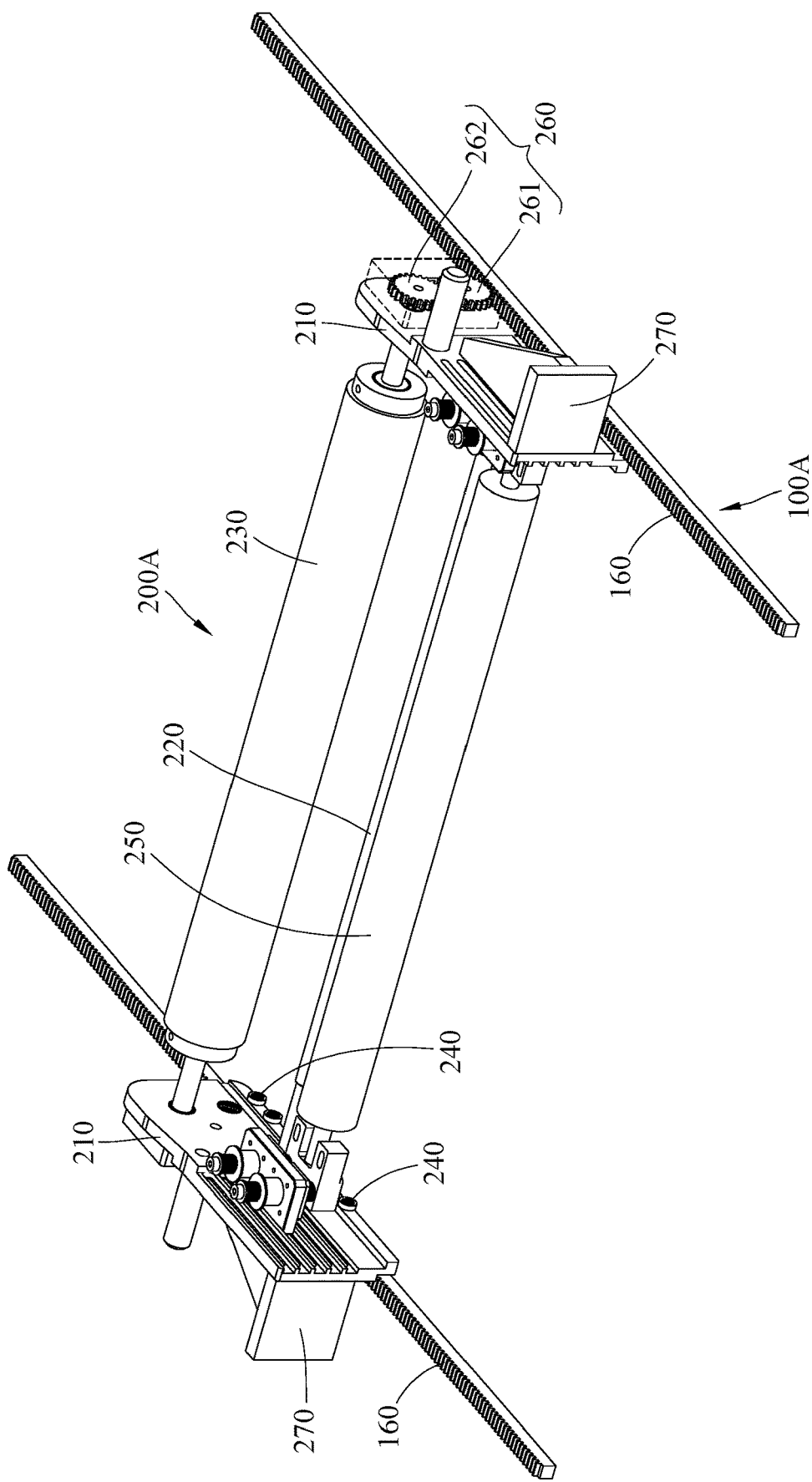
FIG. 14 is a perspective view of racks of a carrier and an uncovering mechanism according to another embodiment of the present disclosure.

Please refer to FIG. 14, which is a perspective view of racks 160 of a carrier 100A and an uncovering mechanism 200A according to another embodiment of the present disclosure. Note that this embodiment is similar to the previous embodiment, and thus differences between them and necessary elements will be mainly illustrated hereinafter. In this embodiment, the carrier 100A further includes two racks 160. The uncovering mechanism 200A includes two sliders 210, a guider 220, a roller 230, a plurality of wheels 240, a rolling contactor 250 and two gear trains 260. The sliders 210 are slidably disposed on the carrier 100A. The guider 220 is fixed to the sliders 210. The roller 230 is rotatably disposed on the sliders 210 and is arranged beside the guider 220. The wheels 240 are rotatably disposed on the slider 210 and placed on the carrier 100A. The rolling contactor 250 is rotatably disposed on the sliders 210, and the guider 220 is located between the roller 230 and the rolling contactor 250. The gear trains 260 are rotatably disposed on the sliders 210, respectively. Each gear train 260 includes a first transmission gear 261 and a second transmission gear 262. The first transmission gears 261 are respectively meshed with the racks 160. The second transmission gears 262 may be, for example, coaxially fixed to the roller 230, and are respectively meshed with the first transmission gears 261. Accordingly, when the sliders 210 moves with respect to the racks 160, the first transmission gears 261 are rotated with respect to the sliders 210 through the action of the racks 160, and the second transmission gears 262 are driven by the first transmission gears 261 to rotate the roller 230 with respect to the sliders 210.

In this embodiment and some other embodiments of the present disclosure, the uncovering mechanism 200A may further include two pushed pieces 270 respectively fixed on the sliders 210. As such, the pushed pieces 270 can be pushed by a mechanical arm 30 (shown in FIG. 15) to achieve the mechanical uncovering process.

Please be noted that the quantities of the racks 160 and the gear trains 260 in this embodiment are not intended to restrict the present disclosure. In some other embodiments of the present disclosure, there may be only one rack and one gear train.

Please be noted that the pushed pieces 270 in this embodiment are optional, and the present disclosure is not limited thereto. In some other embodiments of the present disclosure, there may be only one pushed piece or no pushed piece, and the uncovering mechanism can be pushed by the mechanical arm via the sliders or the rolling contactor, for example.

Figure 15:
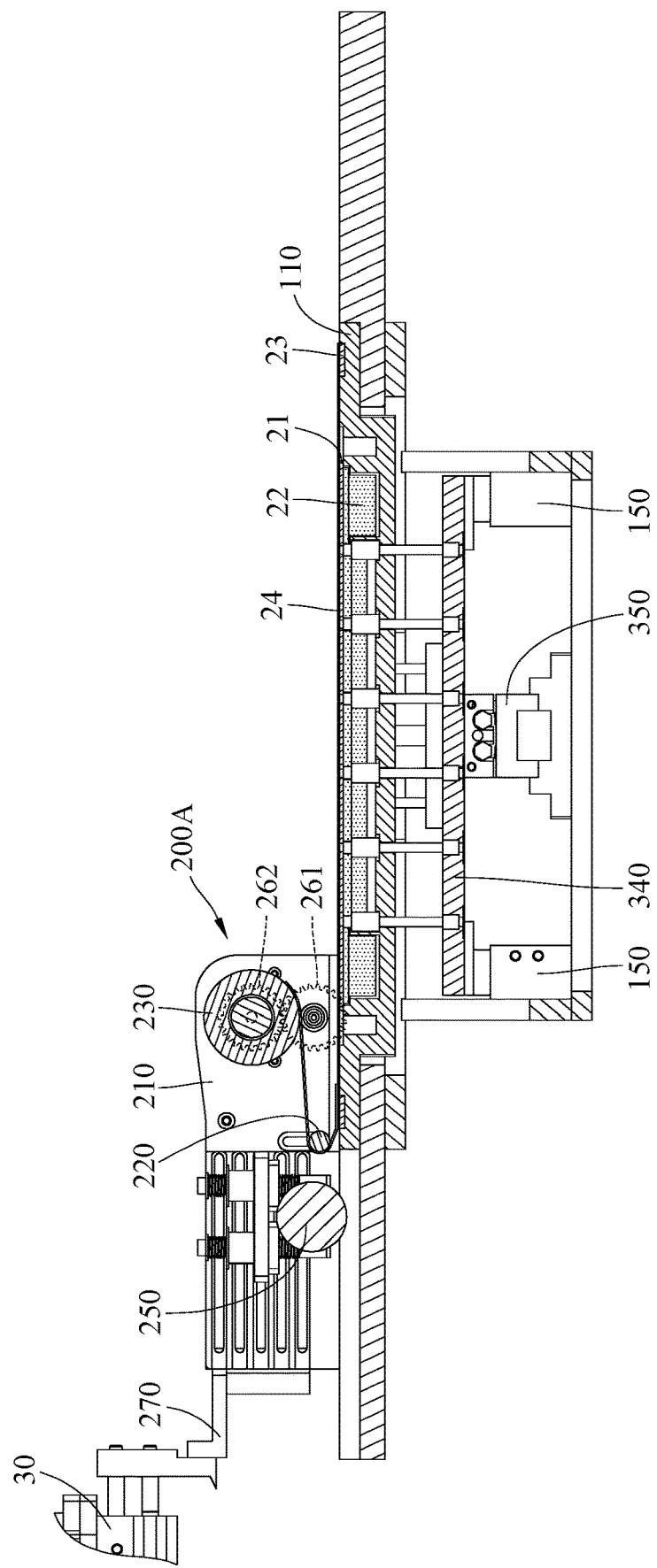
FIG. 15 to FIG. 16 are schematic views showing the action of an uncovering mechanism according to another embodiment of the present disclosure.
Figure 16:
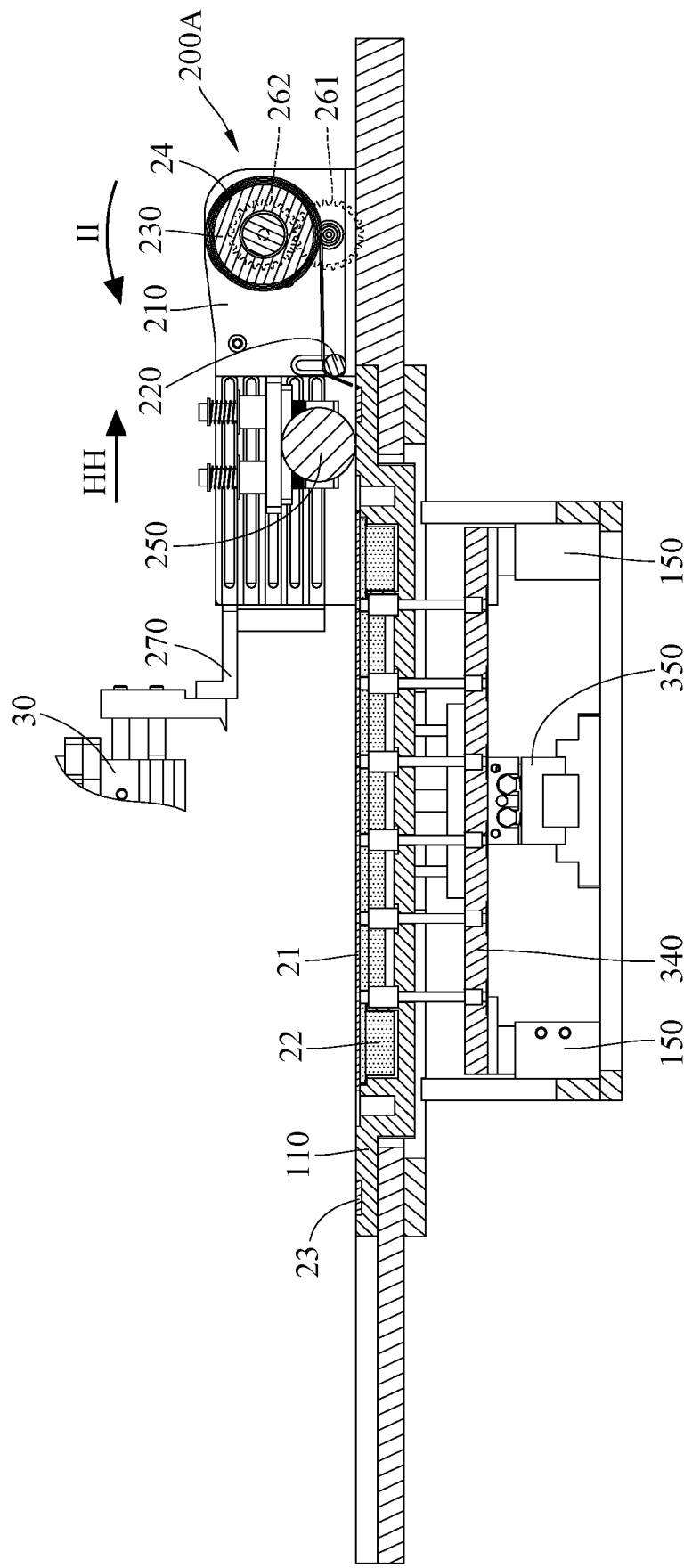

Please further refer to FIG. 15 and FIG. 16, which are schematic views showing the action of the uncovering mechanism 200A in FIG. 14. As shown in FIG. 15, an adhesive tape TP has one end adhered to the film 24 of the semiconductor substrate 20 and another end adhered to the roller 230 via the guider 220 of the uncovering mechanism 200A before the uncovering process. That is, the film 24 of the semiconductor substrate 20 is connected to the roller 230 of the uncovering mechanism 200A via the adhesive tape TP.

Then, as shown in FIG. 16, the pushed pieces 270 of the uncovering mechanism 200A is pushed by the mechanical arm 30 along a direction HH. During the movement of the uncovering mechanism 200A, the film 24 of the semiconductor substrate 20 is forced to be gradually separated from the holder 21 and the fixed frame 23 of the semiconductor substrate 20, the roller 230 is rotated along a direction II by the transmission force provided through the racks 160, the first transmission gears 261 and the second transmission gears 262, and the film 24 separated from the holder 21 and the fixed frame 23 of the semiconductor substrate 20 can be wound on the roller 230 through rotation of the roller 230. By doing so, the uncovering mechanism 200A of this embodiment can uncover the film 24 of the semiconductor substrate 20 with a stable force, and mechanical operation thereof instead of manual work prevents accidental injury of human. Moreover, the rolling contactor 250 can, for example, gently press against the holder 21 and the fixed frame 23 where the film 24 is already removed during the uncovering process, so that the holder 21 and the fixed frame 23 can be prevented from being unwantedly pulled up by the film 24.

Figure 17:
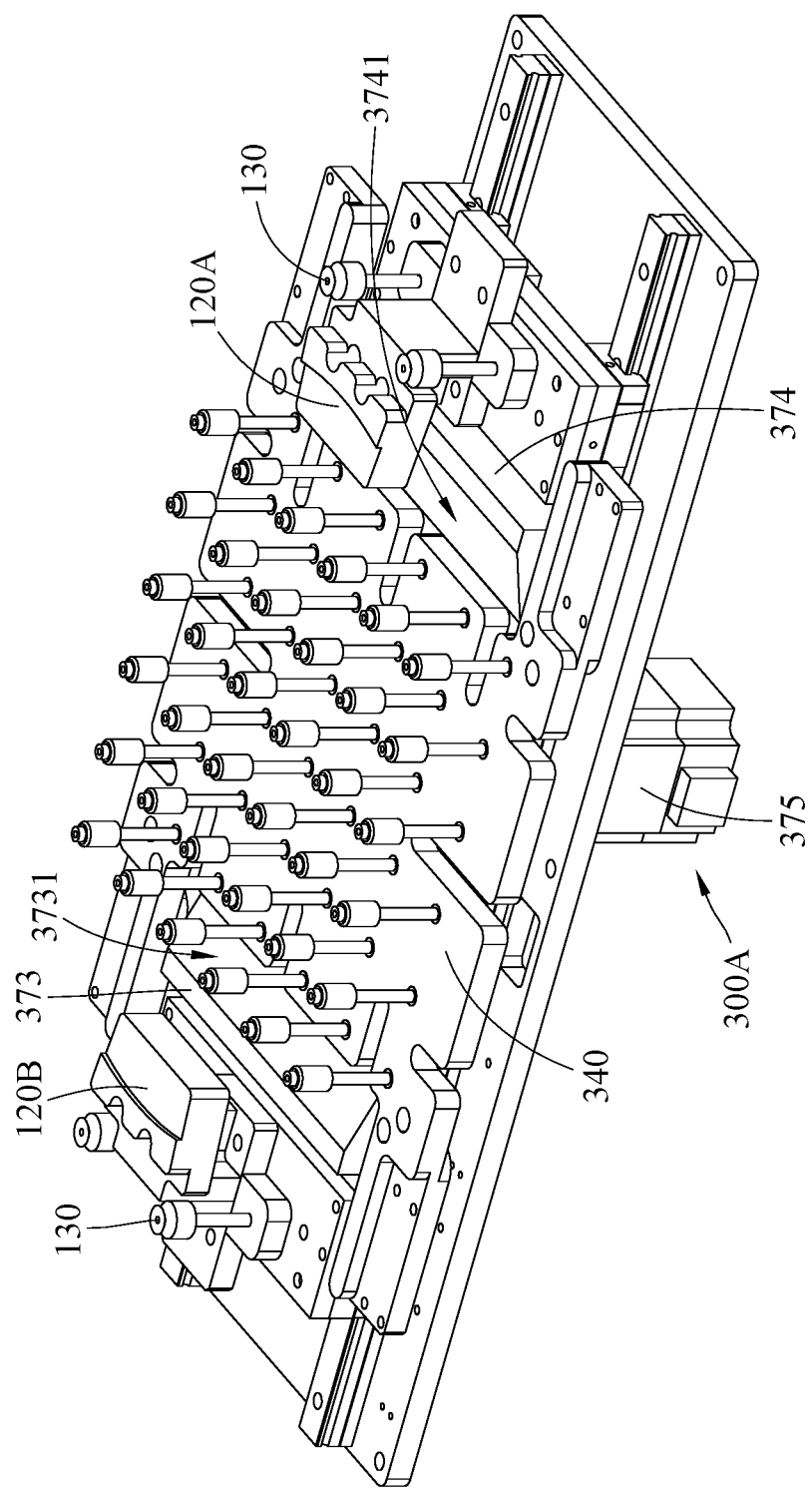
FIG. 17 is a perspective view of a carrier and a lifting mechanism according to further another embodiment of the present disclosure.
Figure 18:
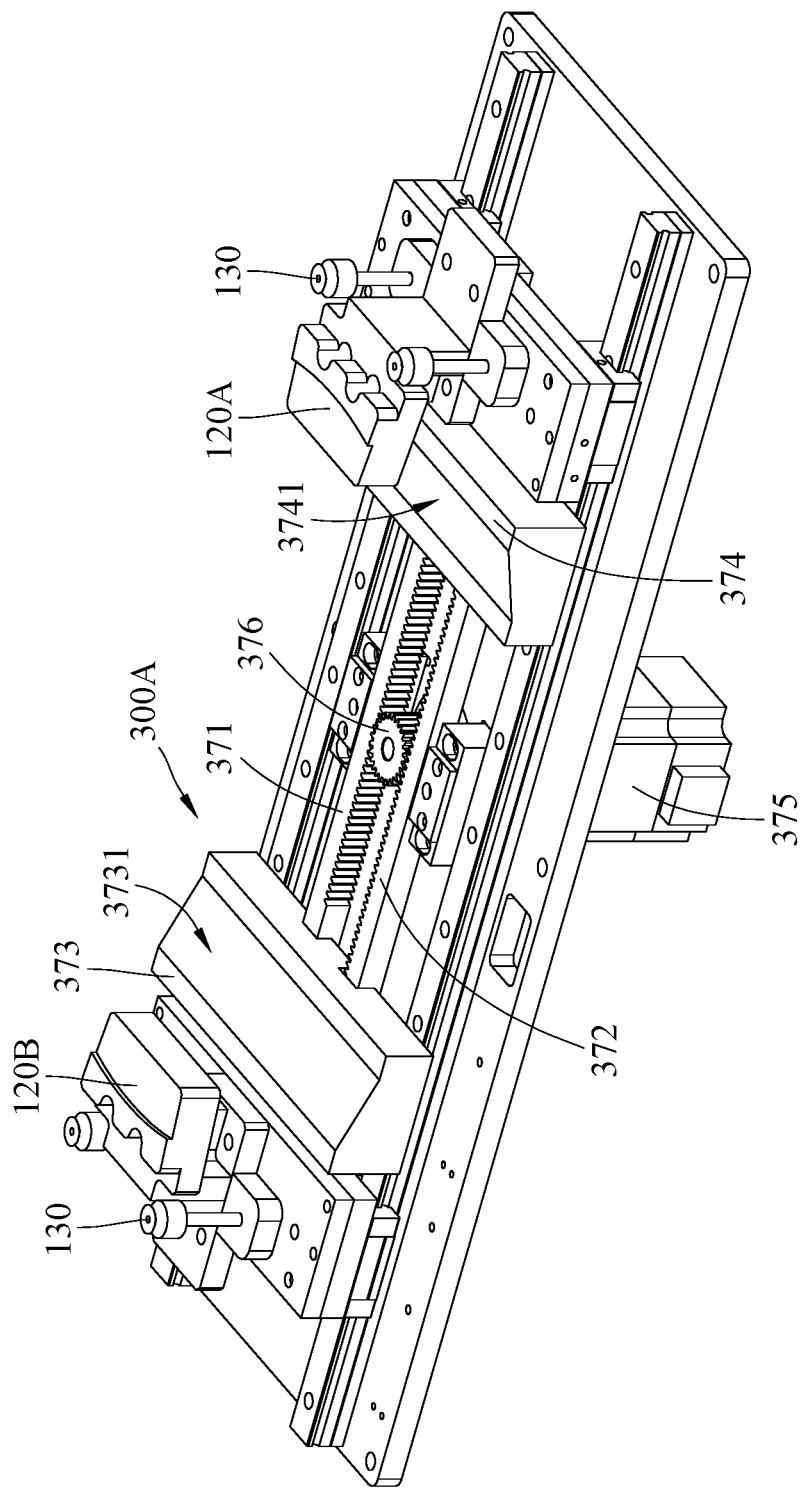
FIG. 18 is a perspective view of a carrier and a lifting mechanism according to further another embodiment of the present disclosure with a pusher been omitted.
Figure 19:
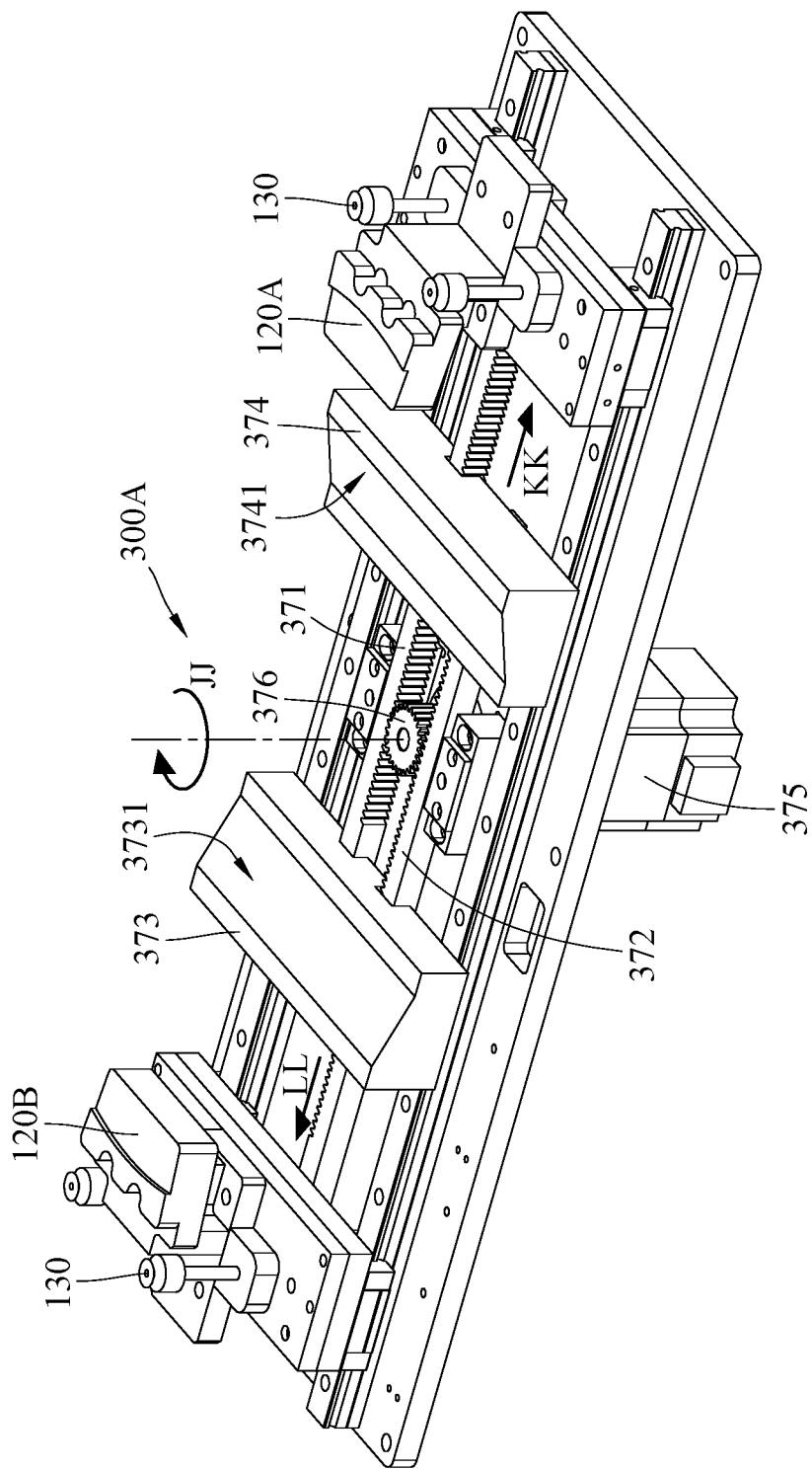
FIG. 19 is a perspective view showing the rotation of an output gear with respect to racks of a lifting mechanism according to further another embodiment of the present disclosure.

Please refer to FIG. 17 to FIG. 19, where FIG. 17 is a perspective view of a carrier 100 and a lifting mechanism 300A according to further another embodiment of the present disclosure, FIG. 18 is a perspective view of the carrier 100 and the lifting mechanism 300A in FIG. 17 with a pusher 340 been omitted for convenience of observation, and FIG. 19 is a perspective view showing the rotation of an output gear 376 with respect to racks 371 of the lifting mechanism 300A in FIG. 17. Note that this embodiment is similar to the previous embodiment, and thus differences between them and necessary elements will be mainly illustrated hereinafter.

Figure 6:
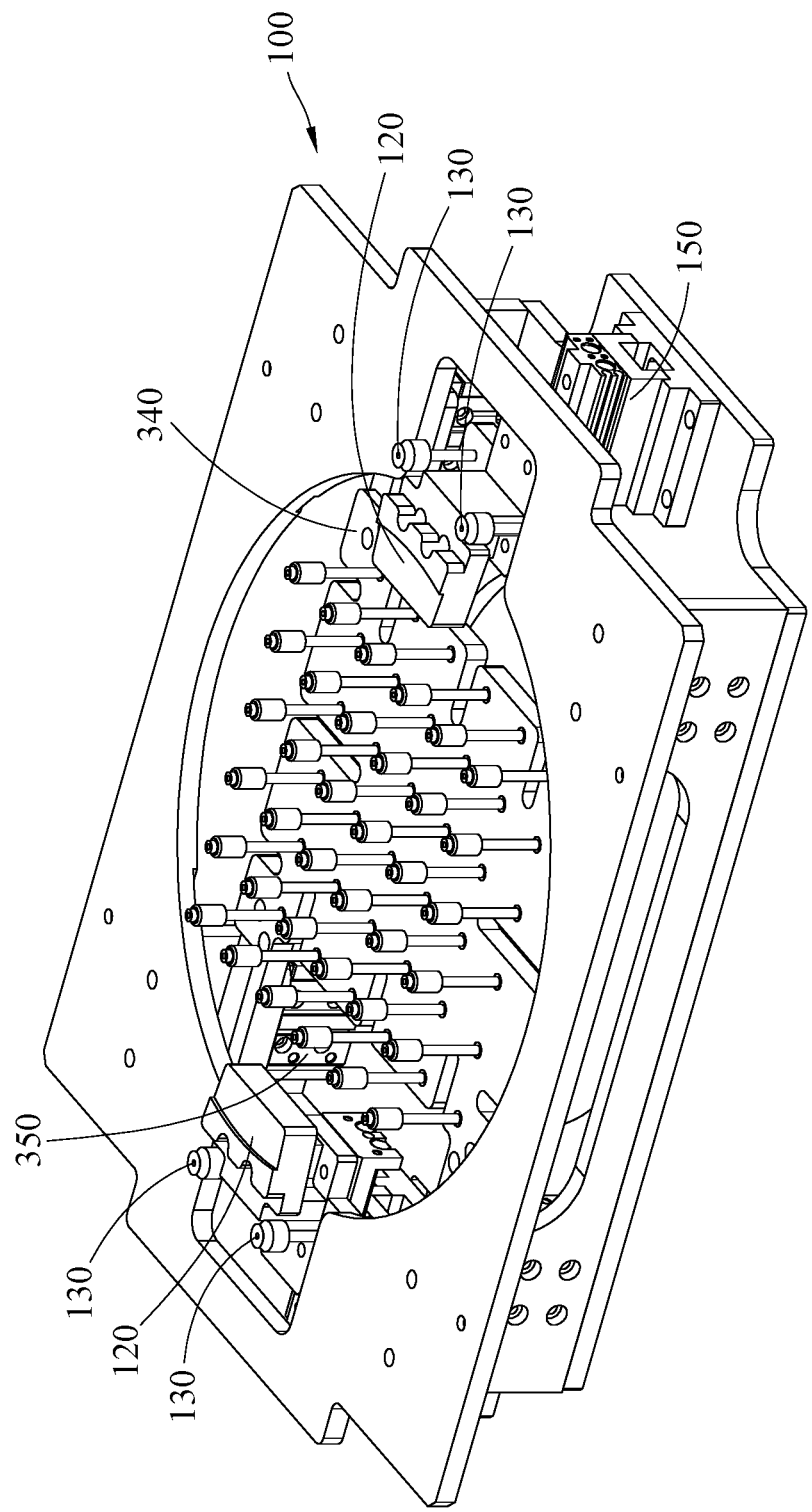
FIG. 6 is a perspective view of a carrier a film removal apparatus according to one embodiment of the present disclosure with the base been omitted.

The lifting mechanism 300A includes the pusher 340 movably disposed in the carrier 100 (numbered in FIG. 6). The holding nozzles 130 are fixed to the lateral movement components 120A and 120B. Moreover, the lifting mechanism 300A further includes two racks 371 and 372, two abutting components 373 and 374 and a driving motor 375. The racks 371 and 372 are disposed in the carrier 100. The lateral movement component 120A and the abutting component 373 are disposed on the rack 371, such that the lateral movement component 120A, the abutting component 373 and the rack 371 can be moved together. Also, the lateral movement component 120B and the abutting component 374 are disposed on the rack 372, such that the lateral movement component 120B, the abutting component 374 and the rack 372 can be moved together. The driving motor 375 is disposed on the carrier 100 and has an output gear 376 meshed with the racks 371 and 372. As shown in FIG. 19, when the output gear 376 rotates along a direction JJ, the racks 371 and 372 are driven by the output gear 376 to be moved respectively along directions KK and LL, and then the lateral movement components 120A and 120B and the abutting components 373 and 374 are driven by the racks 371 and 372 to be moved with respect to the carrier 100. Moreover, the abutting components 373 and 374 respectively have inclined surfaces 3731 and 3741. The pusher 340 can be abutted by the abutting components 373 and 374 through the inclined surfaces 3731 and 3741 so as to be lifted or lowered with respect to the carrier 100.

Please be noted that the quantities of the racks 371 and 372 and the abutting components 373 and 374 are not intended to restrict the present disclosure. In some other embodiments of the present disclosure, there may be only one rack and one abutting component.

Figure 20:
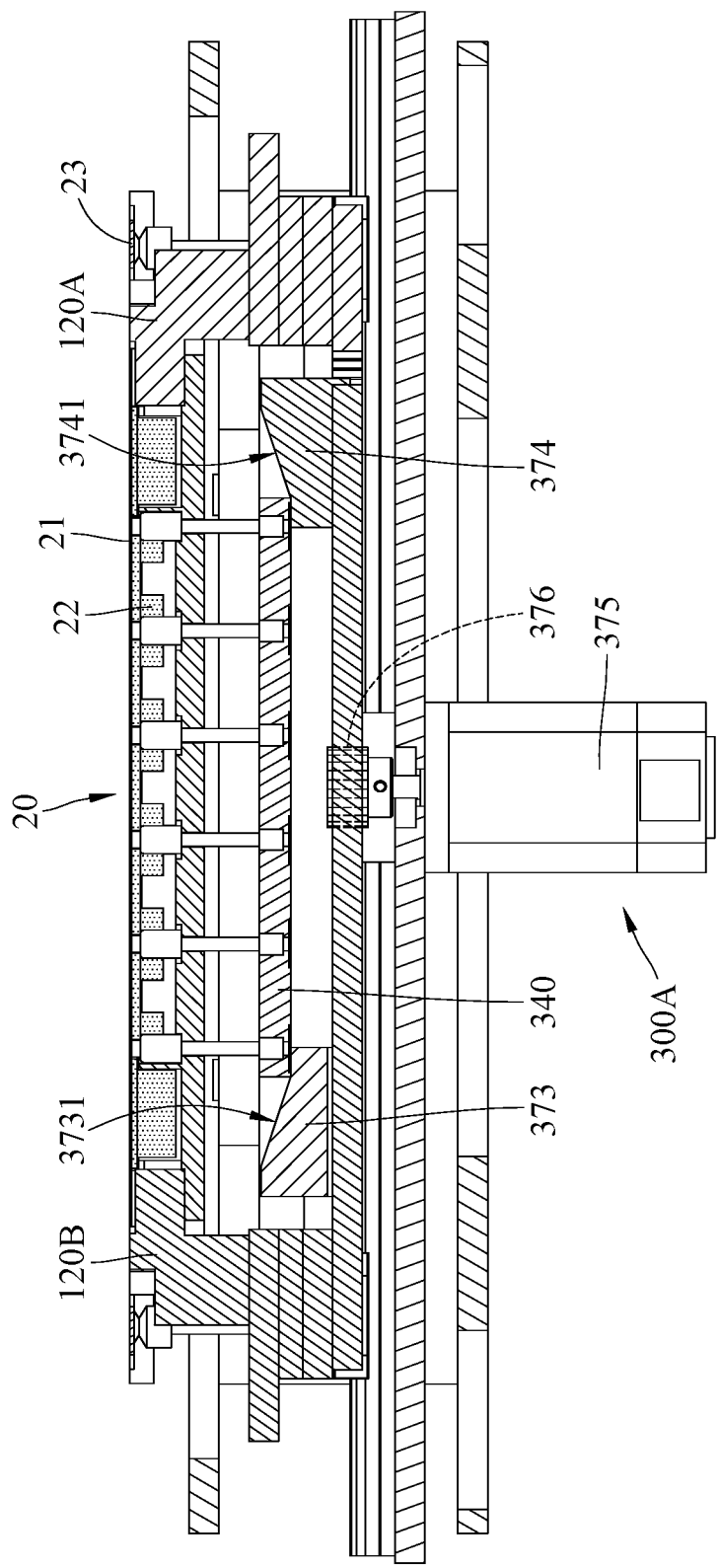
FIG. 20 and FIG. 21 are schematic views showing the action of a lifting mechanism according to further another embodiment of the present disclosure.
Figure 21:
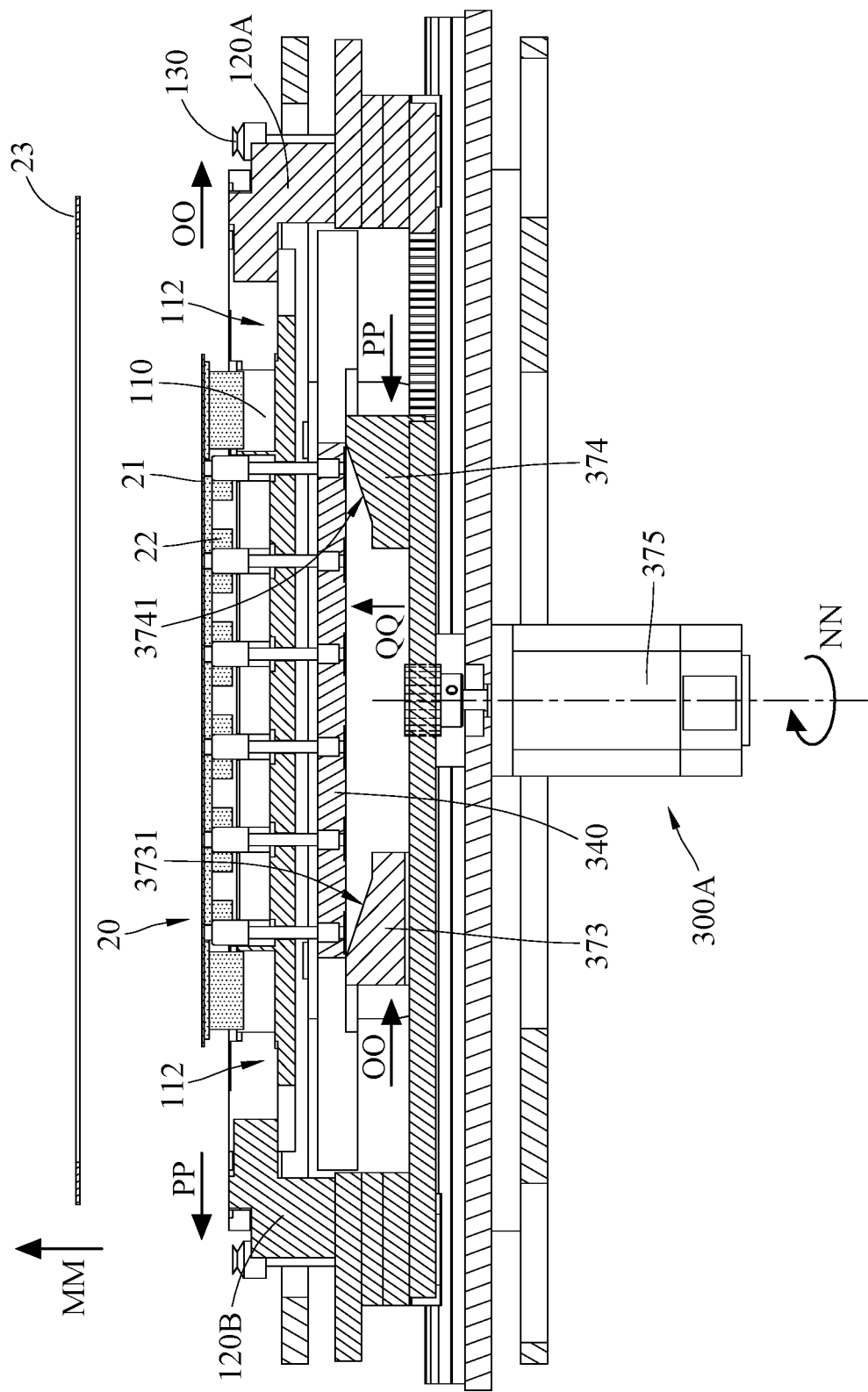

Please refer to FIG. 20 and FIG. 21, which are schematic views showing the action of the lifting mechanism 300A in FIG. 17. As shown in FIG. 20, the film 24 of the semiconductor substrate 20 is already removed from the holder 21 and the fixed frame 23 of the semiconductor substrate 20. Then, as shown in FIG. 21, the fixed frame 23 can be removed along a direction MM, and then the driving motor 375 rotates the output gear 376 along a direction NN. As such, the output gear 376 drives the racks 371 and 372 to move along directions OO and PP, respectively. By doing so, the lateral movement component 120A and the abutting component 373 are driven by the rack 371 to be moved along the direction OO, and the lateral movement component 120B and the abutting component 374 are driven by the rack 372 to be moved along the direction PP. Accordingly, the lateral movement components 120A and 120B are moved away from each other to be located outside the notches 112, and the abutting components 373 and 374 are moved towards each other to lift the pusher 340 along a direction QQ through the inclined surfaces 3731 and 3741 of the abutting components 373 and 374.

Then, since the lateral movement components 120A and 120B are moved outside the notches 112 of the base 110, the spaces in the notches 112 are exposed for convenience of the careful removal of the holder 21 holding the electronic parts 22. Accordingly, the problems existing in convention of which the semiconductor substrate is difficult to be directly removed from the base and the semiconductor substrate is easily damaged due to uneven force applied thereon can be solved.

According to the film removal apparatus and the uncovering mechanism discussed above, the uncovering mechanism provided with the slider, the guider and the roller can uncover the film of the semiconductor substrate with a stable force, and mechanical operation thereof instead of manual work prevents accidental injury of human.

Further, the semiconductor substrate can be lifted by the cooperation of the movement assembly and the transfer nozzles located over the carrier, the cooperation of the pusher and the pneumatic cylinders disposed in the carrier, or the cooperation of the pusher, the racks and the abutting components disposed in the carrier, which prevents damage of the semiconductor substrate due to improper external force applied thereon during the lifting process.

Furthermore, the movement of the lateral movement components outside the notches of the base is able to expose the spaces in the notches, which is convenient for the careful removal of the holder holding the electronic parts. Accordingly, the problems existing in convention of which the semiconductor substrate is difficult to be directly removed from the base and the semiconductor substrate is easily damaged due to uneven force applied thereon can be solved.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A film removal apparatus, suitable for uncovering a film of a semiconductor substrate, the film removal apparatus comprising:
   a carrier, supporting the semiconductor substrate;
   an uncovering mechanism, comprising a slider, a guider and a roller, wherein the slider is slidably disposed on the carrier, the guider is fixed to the slider, and the roller is rotatably disposed on the slider and arranged beside the guider, and the uncovering mechanism is to uncover the film from the semiconductor substrate; and
   a lifting mechanism, selectively separating the semiconductor substrate away from the carrier.

2. The film removal apparatus according to claim 1, wherein the carrier comprises a plurality of holding nozzles selectively to suck and fix the semiconductor substrate.

3. The film removal apparatus according to claim 2, wherein the carrier further comprises a base and a lateral movement component, the base comprises a notch, the lateral movement component is slidably disposed on the base between a closed position and an open position, and the plurality of holding nozzles are disposed on the lateral movement component, the lateral movement component is located in the notch when the lateral movement component is located at the closed position, and the lateral movement component is at least partially located outside the notch when the lateral movement component is located at the open position.

4. The film removal apparatus according to claim 3, wherein the carrier comprises two lateral movement components, the base comprises two notches, and the notches are respectively located at two opposite sides of the base.

5. The film removal apparatus according to claim 3, wherein the lifting mechanism comprises a pusher, and the pusher is movably disposed in the carrier to selectively separate the semiconductor substrate away from the carrier.

6. The film removal apparatus according to claim 5, wherein the lateral movement component and the pusher are driven by a pneumatic cylinder so as to be moved with respect to the base.

7. The film removal apparatus according to claim 5, wherein the lifting mechanism further comprises a rack, an abutting component and a driving motor, the rack is disposed on the carrier, the lateral movement component and the abutting component are disposed on the rack, the driving motor is disposed on the carrier and comprises an output gear, the output gear is meshed with the rack, the lateral movement component and the abutting component are driven by the driving motor through the output gear and the rack so as to be moved with respect to the carrier, the abutting component comprises an inclined surface, and the pusher is abutted by the abutting component through the inclined surface so as to be lifted or lowered with respect to the carrier.

8. The film removal apparatus according to claim 7, wherein the lifting mechanism comprises two racks and two abutting components, the carrier comprises two lateral movement components, the output gear is meshed with the racks, the lateral movement components are respectively disposed on the racks, and the abutting components are respectively disposed on the racks.

9. The film removal apparatus according to claim 3, wherein the lifting mechanism comprises a movement assembly and a plurality of transfer nozzles, and the plurality of transfer nozzles are disposed on the movement assembly to selectively suck and separate the semiconductor substrate away from the base of the carrier.

10. The film removal apparatus according to claim 1, wherein the uncovering mechanism further comprises a plurality of wheels, and the plurality of wheels are rotatably disposed on the slider and placed on the carrier.

11. The film removal apparatus according to claim 1, wherein the carrier comprises a base and a rack, the rack is disposed on the base, the uncovering mechanism further comprises a gear train rotatably disposed on the slider, and the gear train comprises a first transmission gear meshed with the rack and a second transmission gear fixed to the roller and meshed with the first transmission gear.

12. The film removal apparatus according to claim 11, wherein the second transmission gear and the roller are coaxial.

13. The film removal apparatus according to claim 1, wherein the uncovering mechanism further comprises a rolling contactor rotatably disposed on the slider, and the guider is located between the roller and the rolling contactor.

14. The film removal apparatus according to claim 1, wherein the uncovering mechanism further comprises a pushed piece fixed on the slider and selectively pushed by a mechanical arm.

15. An uncovering mechanism, suitable for uncovering a film of a semiconductor substrate located on a carrier, the uncovering mechanism comprising:
a slider, slidably disposed on the carrier;
a guider, fixed to the slider;
a roller, rotatably disposed on the slider and arranged beside the guider; and
a plurality of wheels, rotatably disposed on the slider and placed on the carrier.

16. The uncovering mechanism according to claim 15, further comprising a gear train rotatably disposed on the slider, wherein the gear train comprises a first transmission gear meshed with a rack of the carrier and a second transmission gear fixed to the roller and meshed with the first transmission gear.

17. The uncovering mechanism according to claim 16, wherein the second transmission gear and the roller are coaxial.

18. The uncovering mechanism according to claim 15, further comprising a rolling contactor rotatably disposed on the slider, wherein the guider is located between the roller and the rolling contactor.

19. The uncovering mechanism according to claim 15, further comprising a pushed piece fixed on the slider and selectively pushed by a mechanical arm.

* * * * *